(12) United States Patent
Nanba (10) Patent No.: US 7,749,333 B2
(45) Date of Patent: Jul. 6, 2010

(54) SUBSTRATE PROCESSING APPARATUS AND METHOD

(75) Inventor: Hiromitsu Nanba, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 12/230,436

(22) Filed: Aug. 28, 2008

(65) Prior Publication Data
US 2009/0056766 A1 Mar. 5, 2009

(30) Foreign Application Priority Data
Aug. 29, 2007 (JP) ............................. 2007-222135
Aug. 7, 2008 (JP) ............................. 2008-204313

(51) Int. Cl.
*B08B 3/00* (2006.01)

(52) U.S. Cl. ............................. 134/26; 134/10; 134/18; 134/33; 134/34

(58) Field of Classification Search ................... 134/26, 134/32, 33, 34, 42, 10, 18
See application file for complete search history.

(56) References Cited

U.S. PATENT DOCUMENTS

| | | | |
|---|---|---|---|
| 5,718,763 A | * | 2/1998 | Tateyama et al. ............. 118/52 |
| 5,882,433 A | * | 3/1999 | Ueno ........................... 134/31 |
| 6,632,289 B2 | * | 10/2003 | Masui et al. ..................... 134/3 |
| 2006/0222315 A1 | * | 10/2006 | Yoshida ....................... 385/147 |

FOREIGN PATENT DOCUMENTS

| | | |
|---|---|---|
| JP | 5-243202 | 9/1993 |
| JP | 2002-368066 | 12/2002 |

* cited by examiner

*Primary Examiner*—Michael Kornakov
*Assistant Examiner*—Naomi Birbach
(74) *Attorney, Agent, or Firm*—Smith, Gambrell & Russell, LLP (57) ABSTRACT

In a substrate processing apparatus, a control section is preset to perform a chemical liquid process by use of a chemical liquid after a rinsing process by use of a rinsing liquid. The control section first executes a step of rotating a substrate at a rotational speed not lower than that used in the rinsing process and supplying the chemical liquid onto the substrate, thereby performing cleaning inside a drain cup by the chemical liquid, while discarding, through a waste line, liquid received by the drain cup. The control section then executes a step of rotating the substrate at a decreased rotational speed for the chemical liquid process and supplying the chemical liquid onto the substrate, thereby performing the chemical liquid process on the substrate, while collecting, through a collection line, liquid received by the drain cup.

10 Claims, 8 Drawing Sheets

SUBSTRATE PROCESSING APPARATUS AND METHOD

BACKGROUND OF THE INVENTION

1. Field of the Invention

The present invention relates to a substrate processing apparatus and substrate processing method for performing a predetermined liquid process, such as a cleaning process, on a substrate, such as a semiconductor wafer. The present invention further relates to a storage medium that stores a program for executing the method.

2. Description of the Related Art

In the process of manufacturing semiconductor devices, liquid processes are frequently used, in which a process liquid is supplied onto a target substrate, such as a semiconductor wafer or glass substrate. For example, a process of this kind is a cleaning process for removing particles and/or contaminants deposited on a substrate.

As a substrate processing apparatus used for this purpose, there is known an apparatus that performs a cleaning process on a substrate, such as a semiconductor wafer, held on a spin chuck, in which a process liquid, such as a chemical liquid, is supplied onto the substrate, while the substrate is rotated. In general, according to apparatuses of this kind, a process liquid is supplied onto the center of a substrate, and the substrate is rotated to spread the process liquid outward, thereby forming a liquid film and throwing off the process liquid out of the substrate. After the cleaning process, a rinsing process is performed, such that a rinsing liquid, such as purified water, is supplied onto the substrate, while the substrate is rotated at a speed higher than the chemical liquid process, thereby forming a liquid film of the rinsing liquid and throwing off the rinsing liquid out of the substrate. In light of this, there proposed a structure in which a drain cup is disposed to surround a substrate and to receive and discharge a process liquid or rinsing liquid thrown off outward from the substrate (for example, Jpn. Pat. Appln. KOKAI Publication No. 2002-368066).

According to this substrate processing apparatus, an alkaline chemical liquid and/or an acidic chemical liquid are used as chemical liquids. Since these chemical liquids are relatively expensive, there is proposed a technique for collecting and reusing them by circulation (for example, Jpn. Pat. Appln. KOKAI Publication No. 5-243202). In order not to collect a chemical liquid thinned down by mixture of purified water after water washing used as a rinsing process, this publication discloses a method for selectively using a plurality of cups. For the same purpose, this publication further discloses a technique in which a chemical liquid is first discharged to a drain line for several seconds in the initial stage of a chemical liquid process after a water washing process, and then the line is switched to a collection line to collect the chemical liquid.

In the case of the former technique disclosed in Publication No. 5-243202, the apparatus needs to have a larger size with a complex structure. In the case of the latter technique disclosed in Publication No. 5-243202, a rinsing process needs to be performed by use of a higher rotational speed than that used in the chemical liquid process for the sake of a reliable rinsing effect, and causes purified water used as a rinsing liquid to be left at an upper side of a cup. In this case, it takes a longer time to wash away the purified water, thereby increasing the amount of chemical liquid discharged to the drain line, and decreasing the collection rate of the chemical liquid.

BRIEF SUMMARY OF THE INVENTION

An object of the present invention is to provide a substrate processing apparatus and substrate processing method that can efficiently collect a chemical liquid without employing a complex mechanism.

Another object of the present invention is to provide a storage medium that stores a program for executing the substrate processing method.

According to a first aspect of the present invention, there is provided a substrate processing apparatus comprising: a substrate holding member configured to rotate along with a substrate held thereon in a horizontal state; a rotation mechanism configured to rotate the substrate holding member; a chemical liquid supply mechanism including a chemical liquid tank that stores a chemical liquid and configured to supply a chemical liquid from the chemical liquid tank onto the substrate; a rinsing liquid supply mechanism configured to supply a rinsing liquid onto the substrate; an annular drain cup disposed to surround the substrate held on the substrate holding member and to receive liquid scattered from the substrate being rotated; a waste line connected to the drain cup to discard liquid received by the drain cup; a collection line connected to the drain cup to collect liquid received by the drain cup into the chemical liquid tank; a switching mechanism configured to perform switching between collection of liquid through the collection line and discard of liquid through the waste line; and a control section configured to control the chemical liquid supply mechanism in supplying the chemical liquid, the rinsing liquid supply mechanism in supplying the rinsing liquid, the rotation mechanism in rotating the substrate, and the switching mechanism in switching between collection and discard of liquid, wherein the control section is preset to perform a chemical liquid process by use of the chemical liquid after a rinsing process by use of the rinsing liquid, by first rotating the substrate at a rotational speed not lower than that used in the rinsing process and supplying the chemical liquid onto the substrate, thereby performing cleaning inside the drain cup by the chemical liquid, while setting a state where the waste line is enabled and the collection line is disabled, thereby discarding, through the waste line, liquid received by the drain cup, and then, rotating the substrate at a decreased rotational speed for the chemical liquid process and supplying the chemical liquid onto the substrate, thereby performing the chemical liquid process on the substrate, while setting a state where the waste line disabled and the collection line is enabled, thereby collecting, through the collection line, liquid received by the drain cup.

In the first aspect, the apparatus may further comprise a rotary cup disposed inside the drain cup to surround the substrate held on the substrate holding member and to rotate along with the substrate holding member and substrate, the rotary cup being configured to receive liquid thrown off from the substrate being rotated, to guide the liquid to the drain cup, and to generate a circular flow of the liquid by its rotation inside the drain cup.

The control section may be preset to execute: rotating a first substrate at a first rotational speed and supplying the rinsing liquid onto the first substrate, thereby performing a rinsing process; then, rotating a target substrate, which is the first substrate or a new second substrate, at a second rotational speed not lower than the first rotational speed and supplying the chemical liquid onto the target substrate, thereby performing an auxiliary process, while setting a state where the waste line is enabled and the collection line is disabled, thereby sending liquid received by the drain cup into the waste line; and then, rotating the target substrate at a third rotational speed lower than the first rotational speed and supplying the chemical liquid onto the target substrate, thereby performing the chemical liquid process, while setting a state where the waste line is disabled and the collection line is enabled, thereby sending liquid received by the drain cup into the collection line.

In this case, the target substrate may be the second substrate, and the control section may be preset to execute, before the rinsing process, rotating the first substrate at the third rotational speed and supplying the chemical liquid onto the first substrate, thereby performing the chemical liquid process. Alternatively, the target substrate may be the first substrate, and the control section may be preset to execute, before the rinsing process, rotating the first substrate at a rotational speed lower than the first rotational speed and supplying a chemical liquid different from the chemical liquid onto the first substrate, thereby performing a different chemical liquid process.

The control section may be preset to perform the rinsing process, while setting a state where the waste line is enabled and the collection line is disabled, thereby sending liquid received by the drain cup into the waste line. Alternatively, the control section may be preset to perform the rinsing process, while setting a state where a waste line different from the waste line is enabled and the collection line is disabled, thereby sending liquid received by the drain cup into the different waste line.

The waste line and the collection line may be connected through a common discharge tube to the drain cup, and the switching mechanism may comprise a switching valve disposed on the discharge tube at a position where the waste line and the collection line are branched and configured to be controlled by the control section. The rotary cup may be provided with a member connected thereto and inserted into the drain cup, so as to rotate along with the rotary cup to assist generation of the circular flow. The member for assisting generation of the circular flow may be a lower portion of a cylindrical outer wall portion of the rotary cup.

According to a second aspect of the present invention, there is provided a substrate processing method for performing a substrate process by supplying a chemical liquid and a rinsing liquid onto a substrate held on a substrate holding member configured to rotate along with the substrate and surrounded by an annular drain cup configured to receive liquid scattered from a substrate being rotated, the method comprising: performing a rinsing process while supplying the rinsing liquid onto the substrate; and performing a chemical liquid process while supplying the chemical liquid onto the substrate, wherein the method comprises performing the chemical liquid process by use of the chemical liquid after the rinsing process by use of the rinsing liquid, by first rotating the substrate at a rotational speed not lower than that used in the rinsing process and supplying the chemical liquid onto the substrate, thereby performing cleaning inside the drain cup by the chemical liquid, while discarding liquid received by the drain cup, and then, rotating the substrate at a decreased rotational speed for the chemical liquid process and supplying the chemical liquid onto the substrate, thereby performing the chemical liquid process on the substrate, while collecting liquid received by the drain cup.

According to a third aspect of the present invention, there is provided a computer readable storage medium that stores a program for execution on a computer, wherein the program, when executed, causes the computer to control a substrate processing apparatus to conduct a substrate processing method for performing a substrate process by supplying a chemical liquid and a rinsing liquid onto a substrate held on a substrate holding member configured to rotate along with the substrate and surrounded by an annular drain cup configured to receive liquid scattered from a substrate being rotated, the method comprising: performing a rinsing process while supplying the rinsing liquid onto the substrate; and performing a chemical liquid process while supplying the chemical liquid onto the substrate, wherein the method comprises performing the chemical liquid process by use of the chemical liquid after the rinsing process by use of the rinsing liquid, by first rotating the substrate at a rotational speed not lower than that used in the rinsing process and supplying the chemical liquid onto the substrate, thereby performing cleaning inside the drain cup by the chemical liquid, while discarding liquid received by the drain cup, and then, rotating the substrate at a decreased rotational speed for the chemical liquid process and supplying the chemical liquid onto the substrate, thereby performing the chemical liquid process on the substrate, while collecting liquid received by the drain cup.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 1 is a sectional view schematically showing the structure of a substrate processing apparatus according to an embodiment of the present invention;

DETAILED DESCRIPTION OF THE INVENTION

Embodiments of the present invention will now be described with reference to the accompanying drawings. In the following description, an explanation will be given of a case where the present invention is applied to a liquid processing apparatus that can perform a cleaning process on the front and back surfaces of a semiconductor wafer (which will be simply referred to as "wafer", hereinafter).

Figure 2:
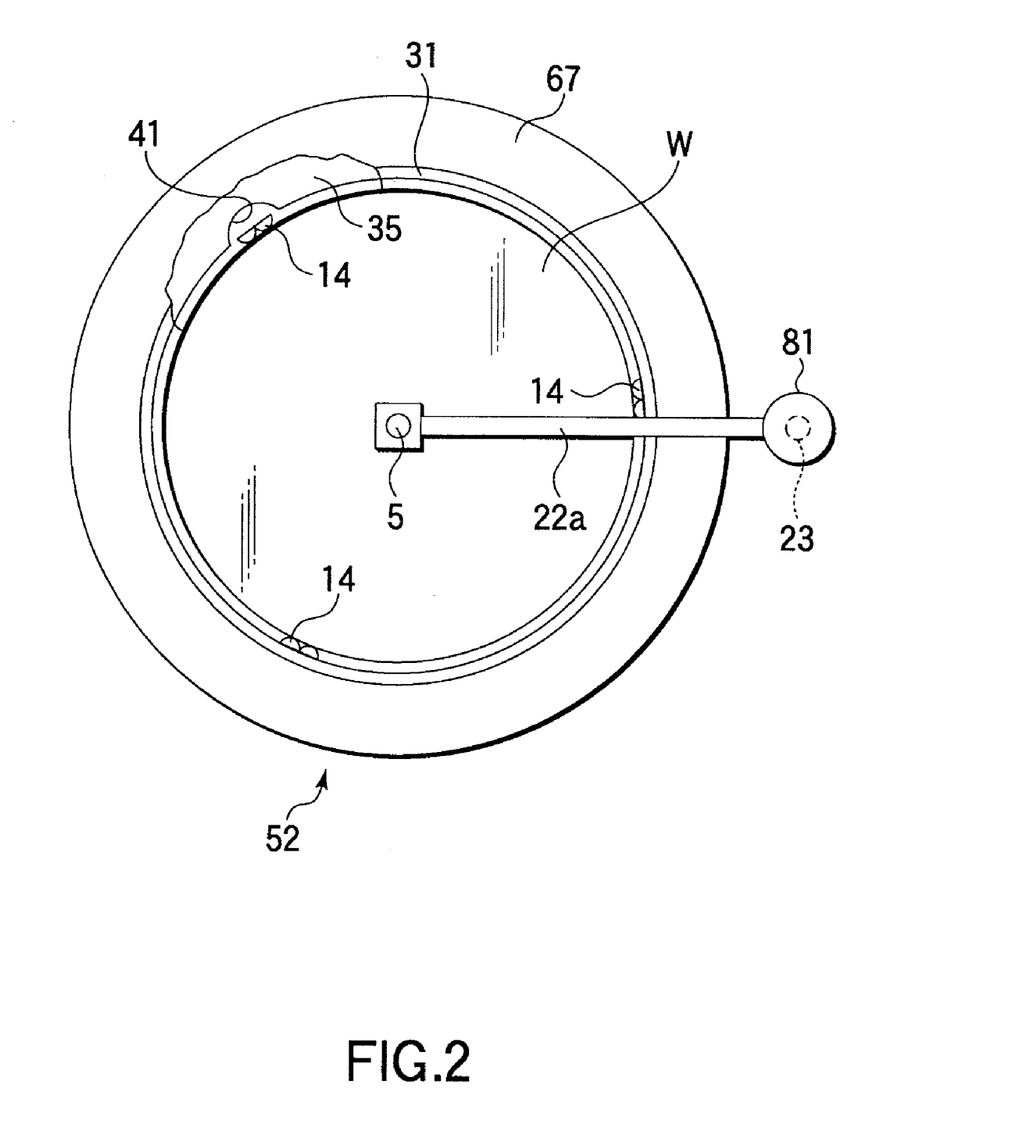
FIG. 2 is a partially sectional plan view schematically showing the substrate processing apparatus according to an embodiment of the present invention.
Figure 3:
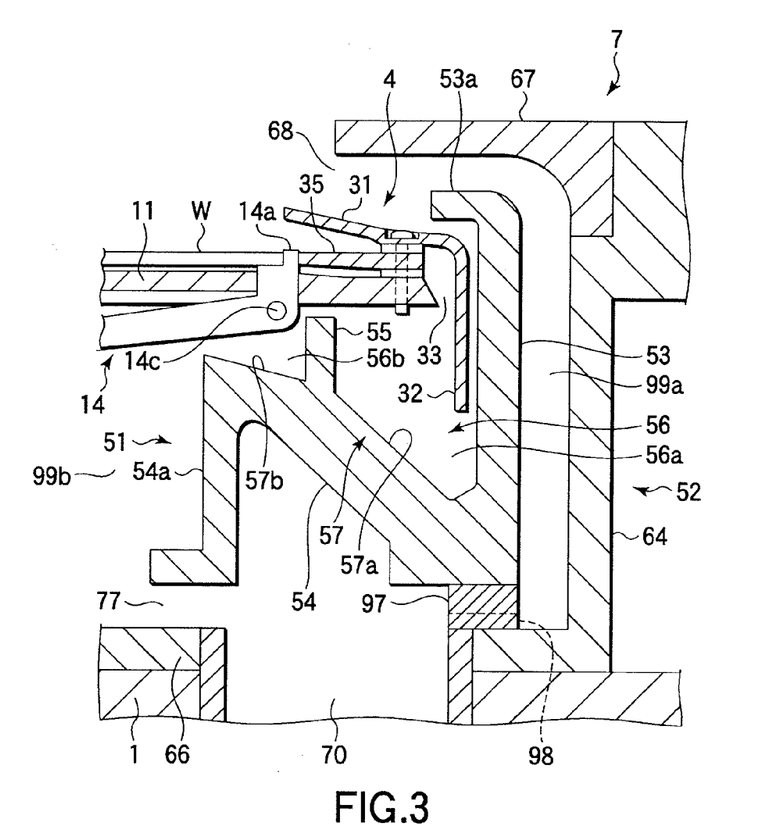
FIG. 3 is an enlarged sectional view showing an exhaust/drain section used in the substrate processing apparatus shown in FIG. 1.

FIG. 1 is a sectional view schematically showing the structure of a substrate processing apparatus according to an embodiment of the present invention. FIG. 2 is a plan view of the apparatus shown in FIG. 1. FIG. 3 is an enlarged sectional view showing an exhaust/drain section used in the substrate processing apparatus shown in FIG. 1.

A liquid processing system (not shown) contains a plurality of apparatuses disposed therein, each of which is the same as this substrate processing apparatus 100. As shown in FIG. 1 and FIG. 2, this substrate processing apparatus 100 includes a base plate 1 and a wafer holding member 2 for rotatably holding a target substrate or wafer W. The wafer holding member 2 is rotatable by a rotary motor 3. A rotary cup 4 is disposed to surround the wafer W held on the wafer holding member 2 and configured to rotate along with the wafer holding member 2. The substrate processing apparatus 100 further includes a front side liquid supply nozzle 5 for supplying a process liquid onto the front surface of the wafer W, and a back side liquid supply nozzle 6 for supplying a process liquid onto the back surface of the wafer W. Further, an exhaust/drain section 7 is disposed around the rotary cup 4. A casing 8 is disposed to cover the area around the exhaust/drain section 7 and the area above the wafer W. The casing 8 is provided with a gas flow inlet section 9 at the top, which is arranged to receive, through an inlet port 9a formed on a lateral side, a gas flow supplied from a fan/filter unit (FFU) 9 of the liquid processing system, so that clean air is supplied as a down flow onto the wafer W held on the wafer holding member 2.

The wafer holding member 2 includes a rotary plate 11 formed of a circular plate set in a horizontal state. The center of the bottom of the rotary plate 11 is connected to a cylindrical rotary shaft 12 extending vertically downward. The rotary plate 11 has a circular opening 11a at the center, which communicates with a bore 12a formed inside the rotary shaft 12. An elevating member 13 supporting the back side liquid supply nozzle 6 is movable up and down through the bore 12a and opening 11a. As shown in FIG. 2, the rotary plate 11 is provided with three holding accessories 14 disposed at regular intervals for holding the outer edge of the wafer W. The holding accessories 14 are configured to hold the wafer W in a horizontal state such that the wafer W is slightly separated from the rotary plate 11. Each of the holding accessories 14 includes a holding portion 14a configured to hold the edge of the wafer W, an operation lever 14b extending from the holding portion 14a toward the center of the lower surface of the rotary plate, and a pivot shaft 14c that supports the holding portion 14a to be vertically rotatable. When the distal end of the operation lever 14b is pushed up by a cylinder mechanism (not shown), the holding portion 14a is rotated outward and cancels the hold on the wafer W. Each holding accessory 14 is biased by a spring (not shown) toward a direction for the holding portion 14a to hold the wafer W, so that the holding accessory 14 can hold the wafer W when the cylinder mechanism does not act thereon.

The rotary shaft 12 is rotatably supported by the base plate 1 through a bearing mechanism 15 having two bearings 15a. The rotary shaft 12 is provided with a pulley 16 fitted thereon at the lower end. The shaft of the motor 3 is also provided with a pulley 18 fitted thereon. A belt 17 is wound around between these pulleys 16 and 18. The rotary shaft 12 is rotated through the pulley 18, belt 17, and pulley 16 by rotation of the motor 3.

The front side liquid supply nozzle 5 is attached to a nozzle holding member 22 supported on the distal end of a nozzle arm 22a. A chemical liquid or purified water used as a rinsing liquid is supplied through a flow passage 83 formed in the nozzle arm 22a, and is then delivered from a nozzle hole 5a formed in the nozzle 5.

As shown in FIG. 2, the nozzle arm 22a is rotatable by a driving mechanism 81 about a shaft 23 used as a central axis to move the front side liquid supply nozzle 5 between wafer cleaning positions above the center and periphery of the wafer W and a retreat position outside the wafer W. Further, the nozzle arm 22a is movable up and down by an elevating mechanism 82, such as a cylinder mechanism.

The nozzle arm 22a has the flow passage 83 formed therein and connected at one end to the nozzle hole 5a of the front side liquid supply nozzle 5. The other end of the flow passage 83 is connected to a tube 84a, which is provided with valves 86 and 87. The valve 86 is connected to a chemical liquid tank 89 through a tube 88. The valve 87 is connected to a DIW supply source 91 for supplying purified water (DIW) through a tube 90. The chemical liquid and purified water are selectively supplied from the chemical liquid tank 89 and DIW supply source 91 through the tube 84a and flow passage 83 to the front side liquid supply nozzle 5. The chemical liquid tank 89 is connected to a chemical liquid replenishing line 96a for replenishing the chemical liquid and a purified water supply line 96b for supplying purified water for diluting the chemical liquid.

The back side liquid supply nozzle 6 has a nozzle hole 6a formed through the center of the elevating member 13 and extending in the longitudinal direction. The nozzle hole 6a is connected at the lower end to a tube 84b, which is provided with valves 92 and 93. The valve 92 is connected to the chemical liquid tank 89 through a tube 94. The valve 93 is connected to the DIW supply source 91 through a tube 95. The chemical liquid and purified water are selectively supplied from the chemical liquid tank 89 and DIW supply source 91 through the tube 84b to the back side liquid supply nozzle 6.

The chemical liquid may be exemplified by dilute hydrofluoric acid (DHF) used as an acidic chemical liquid and ammonia hydrogen peroxide solution (SC1) used as an alkaline chemical liquid. A chemical liquid or chemical liquids of two or more different types can be selectively supplied. Where chemical liquids of two or more different types are employed, a tank is disposed along with tubes 84a and 84b for each chemical liquid.

The elevating member 13 includes a wafer support head 24 at the top for supporting the wafer W. The wafer support head 24 is provided with three wafer support pins 25 for supporting the wafer W (only two of them are shown) on the upper surface. The lower end of the back side liquid supply nozzle 6 is connected to a cylinder mechanism 27 through a connector 26. The elevating member 13 is movable up and down by the cylinder mechanism 27 to move up and down the wafer W in loading and unloading the wafer W.

The rotary cup 4 includes an annular eaves portion 31 inclined to extend inward and upward from a position above the end of the rotary plate 11 and a cylindrical outer wall portion 32 extending vertically downward from the outer end of the eaves portion 31. As shown in the enlarged view of FIG. 3, an annular gap 33 is formed between the outer wall portion 32 and rotary plate 11, so that the chemical liquid or purified water used as a rinsing liquid scattered by rotation of the wafer W along with the rotary plate 11 and rotary cup 4 is guided downward through the gap 33.

Figure 4:
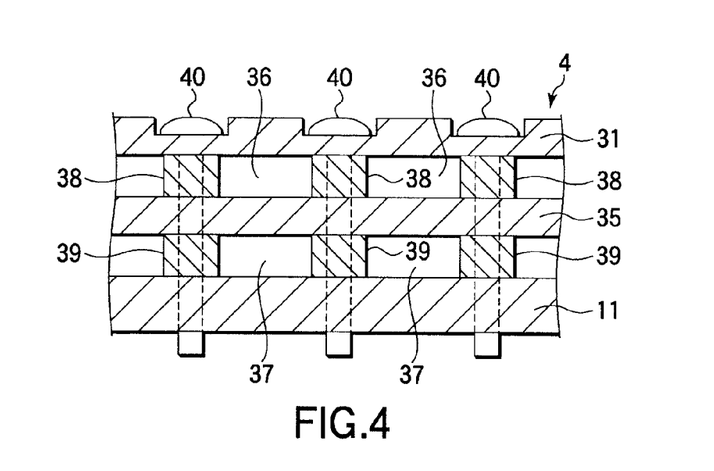
FIG. 4 is a view for explaining the arrangement of a rotary cup and a guide member used in the substrate processing apparatus shown in FIG. 1.

A plate-like guide member 35 is disposed between the eaves portion 31 and rotary plate 11 at a height essentially the same as the wafer W. As shown in FIG. 4, a plurality of spacers 38 and 39 are disposed in an annular direction between the eaves portion 31 and guide member 35 and between the guide member 35 and rotary plate 11 to form openings 36 and 37 for allowing the process liquid or rinsing liquid to pass therethrough. The eaves portion 31, guide member 35, rotary plate 11, and spacers 38 and 39 are fixed to each other by screws 40.

The guide member 35 is arranged such that the upper and lower surfaces thereof are to be almost continued to the front and back surfaces of the wafer W. When a process liquid is supplied onto the center of the front surface of the wafer W from the front side liquid supply nozzle 5 while the wafer holding member 2 and rotary cup 4 are rotated along with the wafer W by the motor 3, the process liquid is spread by a centrifugal force on the front surface of the wafer W and is thrown off from the peripheral edge of the wafer W. The process liquid thus thrown off from the front surface of the wafer W is guided by the upper surface of the guide member 35 almost continued thereto. Then, the process liquid is discharged outward through the openings 36, and is guided downward by the outer wall portion 32. Similarly, when a process liquid is supplied onto the center of the back surface of the wafer W from the back side liquid supply nozzle 6 while the wafer holding member 2 and rotary cup 4 are rotated along with the wafer W, the process liquid is spread by a centrifugal force on the back surface of the wafer W and is thrown off from the peripheral edge of the wafer W. The process liquid thus thrown off from the back surface of the wafer W is guided by the lower surface of the guide member 35 almost continued thereto. Then, the process liquid is discharged outward through the openings 37, and is guided downward by the outer wall portion 32. At this time, since a centrifugal force acts on the process liquid guided to the spacers 38 and 39 and outer wall portion 32, mist of the process liquid is inhibited from returning inward.

Further, since the process liquid thrown off from the front and back surfaces of the wafer W is guided by the guide member 35, the process liquid separated from the peripheral edge of the wafer W can hardly become turbulent. In this case, it is possible to guide the process liquid out of the rotary cup 4 while preventing the process liquid from being turned into mist. As shown in FIG. 2, the guide member 35 has notches 41 at positions corresponding to the wafer holding accessories 14 to accept the wafer holding accessories 14.

The exhaust/drain section 7 is mainly used for collecting exhaust gas and drainage discharged from the space surrounded by the rotary plate 11 and rotary cup 4. As shown in the enlarged view of FIG. 3, the exhaust/drain section 7 includes an annular drain cup 51 disposed to receive the process liquid or rinsing liquid discharged from the rotary cup 4, and an annular exhaust cup 52 accommodating the drain cup 51 and disposed coaxially with the drain cup 51.

As shown in FIGS. 1 and 3, the drain cup 51 includes a cylindrical outer sidewall 53 vertically disposed outside the rotary cup 4 adjacent to the outer wall portion 32, and an internal wall 54 extending inward from the lower end of the outer sidewall 53. The internal wall 54 is connected to an inner sidewall 54a vertically disposed on the inner side. The outer sidewall 53 and internal wall 54 define an annular space used as a liquid receptacle 56 for receiving the process liquid or rinsing liquid discharged from the rotary cup 4. The upper side of the outer sidewall 53 is formed as an extending portion 53a extending to a position above the rotary cup 4 to prevent the process liquid from bouncing out from the drain cup 51. The liquid receptacle 56 includes an annular partition wall 55 disposed therein in an annular direction of the drain cup 51 outside the holding accessories 14 and extending from the internal wall 54 to a position near the lower surface of the rotary plate 11. The interior of the liquid receptacle 56 is divided by the partition wall 55 into a main cup portion 56a and an auxiliary cup portion 56b. The main cup portion 56a is used to receive liquid discharged from the gap 33, while the auxiliary cup portion 56b is used to receive liquid dropping from portions near the holding portions 14a of the holding accessories 14. The bottom surface 57 of the liquid receptacle 56 is divided by the partition wall 55 into a first portion 57a corresponding to the main cup portion 56a and a second portion 57b corresponding to the auxiliary cup portion 56b. The first and second portions 57a and 57b are inclined upward and inward (toward the rotational center). The inner side of the second portion 57b extends inward (toward the rotational center) further from a position corresponding to the holding portions 14a of the holding accessories 14. The partition wall 55 serves to prevent a gas flow formed by the portions of the holding accessories 14 protruding downward below the rotary plate 11 from involving and transferring mist onto the wafer W. The partition wall 55 has a hole 58 formed therein to guide the process liquid from the auxiliary cup portion 56b to the main cup portion 56a (see FIG. 1).

As shown in FIG. 1, the drain cup 51 has a drain port 60 for drainage from the liquid receptacle 56, which is formed in the internal wall 54 at one position on the outermost side and connected to a drain tube 61 for discharging liquid. The drain tube 61 is provided with a switching valve 111, which is connected to a chemical liquid collection line 112 for collecting the chemical liquid. The switching valve 111 is configured to perform switching of the connection of the drain tube 61 between the collection line 112 and a drain line 113 used as a waste line.

When the rotary plate 11 and rotary cup 4 are integrally rotated along with the wafer W, the process liquid or rinsing liquid discharged and received from the rotary cup 4 generates a circular flow inside the drain cup 51 and is discharged through the drain port 60 to the drain tube 61. The circular flow may be generated only by rotation of the rotary plate 11 along with the wafer W. However, in this embodiment, the lower side of the outer wall portion 32 is inserted into the drain cup 51 to generate a circular gas flow when the rotary cup 4 is rotated. In this case, the process liquid or rinsing liquid accompanies the circular gas flow inside the drain cup 51, and generates a circular flow with a higher velocity as compared to a circular flow generated only by rotation of the rotary plate 11 and wafer W. Consequently, the liquid is discharged from the drain port 60 more swiftly.

The exhaust cup 52 includes an outer wall 64 vertically extending outside the vertical wall 53 of the drain cup 51, and an inner wall 65 disposed on the inward side from the holding accessories 14 and vertically extending to have an upper end adjacent to the rotary plate 11. The exhaust cup 52 further includes a bottom wall 66 placed on the base plate 1, and a top wall 67 extending upward and curved from the outer wall 64 to cover an area above the rotary cup 4. The exhaust cup 52 is mainly used for collecting and exhausting gas components from inside and around the rotary cup 4 through an annular inlet port 68 formed between the top wall 67 and the eaves portion 31 of the rotary cup 4. As shown in FIGS. 1 and 3, the exhaust cup 52 has exhaust ports 70 formed in the bottom and each connected to an exhaust tube 71. The exhaust tube 71 is connected to a suction mechanism (not shown) on the downstream side, so that gas is exhausted from around the rotary cup 4. The exhaust ports 70 can be selectively used by switching in accordance with the types of process liquids.

An outer annular space 99a is formed between the outer wall or outer sidewall 53 of the drain cup 51 and the outer wall 64 of the exhaust cup 52. An annular gas flow adjusting member 97 is disposed between the bottom of the drain cup 51 and the bottom of the exhaust cup 52 outside the exhaust ports 70. The gas flow adjusting member 97 has a number of gas-flow holes 98 formed therein and arrayed in an annular direction. The outer annular space 99a and gas-flow adjusting member 97 serve to adjust a gas flow collected in the exhaust cup 52 so as to uniformly discharge it from the exhaust ports 70. Specifically, this exhaust gas flow is guided downward through the annular space or outer annular space 99a uniformly all over an annular direction, and is then supplied with a pressure loss or resistance by the gas flow adjusting member 97 having a number of gas-flow holes 98. Consequently, the gas flow is distributed and is relatively uniformly discharged to the exhaust ports 70 from all around, regardless of the distance from the exhaust ports 70.

On the other hand, an inner annular space 99b is formed between the inner sidewall 54a of the drain cup 51 and the inner wall 65 of the exhaust cup 52. Further, a gap 77 is formed between the drain cup 51 and the bottom wall of the exhaust cup 52 on the inner peripheral side of the drain cup 51. Gas components collected through the inlet port 68 partly flow into the liquid receptacle 56 of the drain cup 51, as well as the outer annular space 99a. This gas flow is guided downward through the liquid receptacle 56 and inner annular space 99b uniformly all over an annular direction, and is relatively uniformly discharged through the gap 77 to the exhaust ports 70.

As described above, the liquid-draining from the drain cup 51 is performed independently of the gas-exhausting from the exhaust cup 52, so that drainage and exhaust gas are guided separately from each other. Further, since the exhaust cup 52 is disposed to surround the drain cup 51, mist leaked out of the drain cup 51 is swiftly discharged from the exhaust ports 70, so that the mist is reliably prevented from diffusing outside.

The substrate processing apparatus 100 includes a process controller 121 comprising a microprocessor (computer), which is connected to and controls the respective components of the substrate processing apparatus 100, such as the rotary motor 3, valves, and cylinder driving mechanism. The process controller 121 is connected to the user interface 122, which includes, e.g., a keyboard and a display, wherein the keyboard is used for a process operator to input commands for operating the respective components of the substrate processing apparatus 100, and the display is used for showing visualized images of the operational status of the respective components of the substrate processing apparatus 100. Further, the process controller 121 is connected to a storage section 123 that stores recipes, i.e., control programs for the process controller 121 to control the substrate processing apparatus 100 so as to perform various processes, and control programs for the respective components of the substrate processing apparatus 100 to perform predetermined processes in accordance with process conditions. The recipes are stored in a storage medium included in the storage section 123. The storage medium may be formed of a medium of the stationary type, such as a hard disk, or a medium of the portable type, such as a CDROM, DVD, or flash memory. Alternatively, the recipes may be used online while they are transmitted from another apparatus through, e.g., a dedicated line, as needed.

A required recipe is retrieved from the storage section 123 and executed by the process controller 121 in accordance with an instruction or the like input through the user interface 122. Consequently, the substrate processing apparatus 100 can perform a predetermined process under the control of the process controller 121.

Next, with reference to FIGS. 5A to 7B, an explanation will be given of an operation of the substrate processing apparatus 100 having the structure described above. The operation described below for performing a cleaning process according to this embodiment is controlled by the process controller 121 in accordance with a recipe stored in the storage section 123.

Figure 5A:
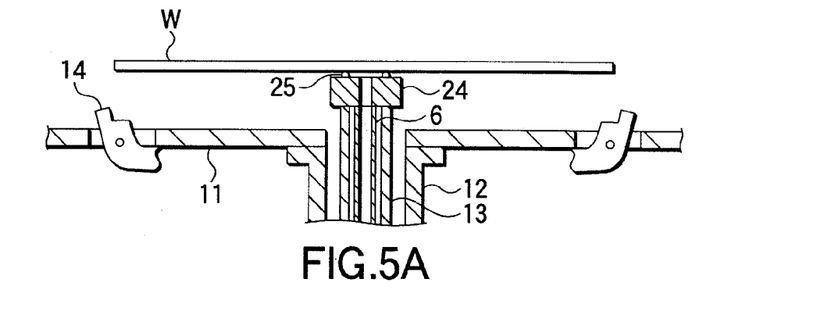
FIGS. 5A to 5D are views for explaining the operation of a cleaning process performed by the substrate processing apparatus according to an embodiment of the present invention.
Figure 5B:
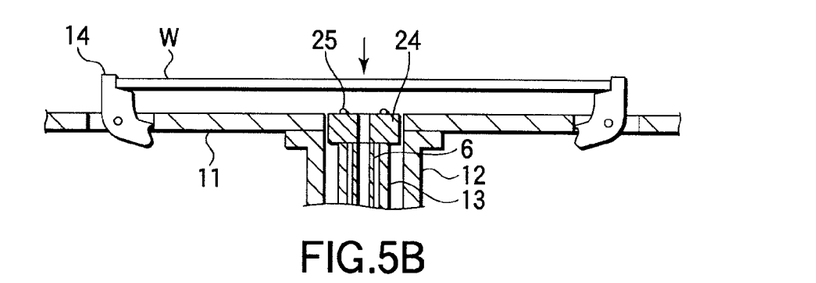
Figure 5C:
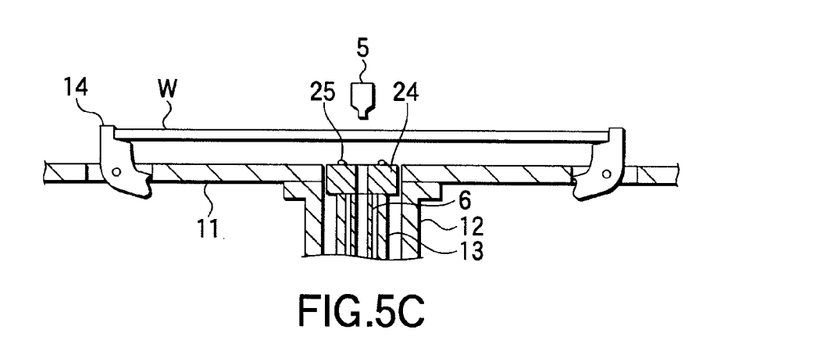

At first, as shown in FIG. 5A, the elevating member 13 is set at the upper position, and a wafer W is transferred from a transfer arm (not shown) onto the support pins 25 of the wafer support head 24. Then, as shown in FIG. 5B, the elevating member 13 is moved down to a position where the wafer W can be held by the holding accessories 14, and then the wafer W is chucked by the holding accessories 14. Then, as shown in FIG. 5C, the front side liquid supply nozzle 5 is moved from the retreat position to the wafer cleaning position.

Figure 5D:
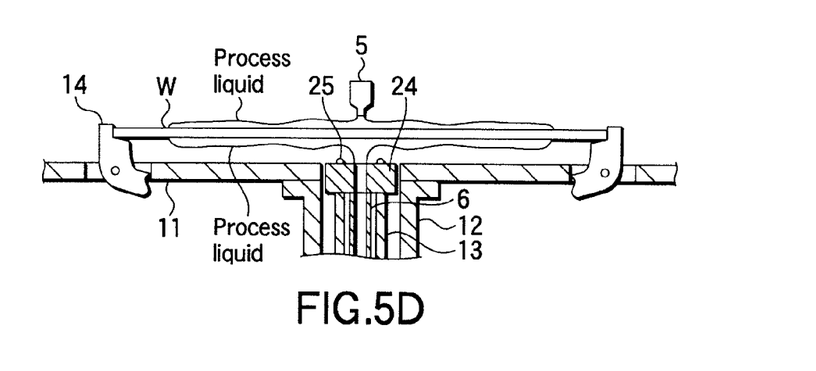

In this state, as shown in FIG. 5D, while the holding member 2 is rotated along with the rotary cup 4 and wafer W by the rotary motor 3, a predetermined chemical liquid or process liquid is supplied from the front side liquid supply nozzle 5 and back side liquid supply nozzle 6 to perform a cleaning process.

In this wafer cleaning process, while the wafer W is rotated, the chemical liquid is supplied from the front side liquid supply nozzle 5 and back side liquid supply nozzle 6 onto the center of the front surface and back surface of the wafer W. Consequently, the chemical liquid is spread outward by a centrifugal force on the wafer W, while applying a cleaning action onto the wafer W. The chemical liquid used for the cleaning action is then thrown off from the peripheral edge of the wafer W. The chemical liquid thus thrown off is guided into the drain cup 51 and is mainly collected through the drain tube 61 and collection line 112 into the chemical liquid tank 89 to reuse it by circulation.

In this chemical liquid process, the rotational speed of the wafer is preferably set to be 200 to 700 rpm. The flow rate of the chemical liquid is preferably set to be 2.0 to 4.0 L/min.

After the chemical liquid process, the process liquid is switched to purified water used as a rinsing liquid. Then, as in the chemical liquid process, as shown in FIG. 5D, while the holding member 2 is rotated along with the rotary cup 4 and wafer W by the rotary motor 3, purified water used as a rinsing liquid is supplied from the front side liquid supply nozzle 5 and back side liquid supply nozzle 6 to perform a rinsing process. At this time, the switching valve 111 is switched from the collection line 112 to the drain line 113 to discard liquid received by the drain cup 51. In this rinsing process, the rotational speed of the wafer is preferably set to be 300 to 1,500 rpm. The flow rate of the purified water is preferably set to be 2.0 to 4.0 L/min.

The cup surrounding the wafer W used in the cleaning process and rinsing process of the wafer W is the rotary cup 4 that is rotated along with the wafer W. Accordingly, when the chemical liquid or rinsing liquid thrown off from the wafer W hits against the rotary cup 4, a centrifugal force acts on the process liquid, and the process liquid is thereby inhibited from being scattered (turned into mist), unlike a case where a stationary cup is used for the same purpose. Then, the process liquid is guided downward by the rotary cup 4, and is discharged through the gap 33 into the main cup portion 56*a* of the liquid receptacle 56 of the drain cup 51. Further, since the rotary plate 11 has holes for inserting the holding portions 14*a* at positions where the holding accessories 14 are attached, the process liquid drops through the holes into the auxiliary cup portion 56*b* of the drain cup 51. The chemical liquid or rinsing liquid received by the drain cup 51 is discharged through the drain port 60 to the drain tube 61, while it is circulated inside the drain cup 51. At this time, along with rotation of the rotary cup 4, a circular gas flow is generated by the outer wall portion 32 inside the drain cup 51, and the chemical liquid or rinsing liquid accompanies the circular gas flow inside the drain cup 51. Consequently, the process liquid generates a circular flow with a higher velocity inside the drain cup 51, so that the process liquid is discharged through the drain port 60 to the drain tube 61 in a shorter time.

Further, gas components are mainly collected into the exhaust cup 52 from inside and around the rotary cup 4 through the annular inlet port 68 formed between the top wall 67 and the eaves portion 31 of the rotary cup 4, and are then exhausted through the exhaust ports 70 to the exhaust tubes 71.

Figure 6:
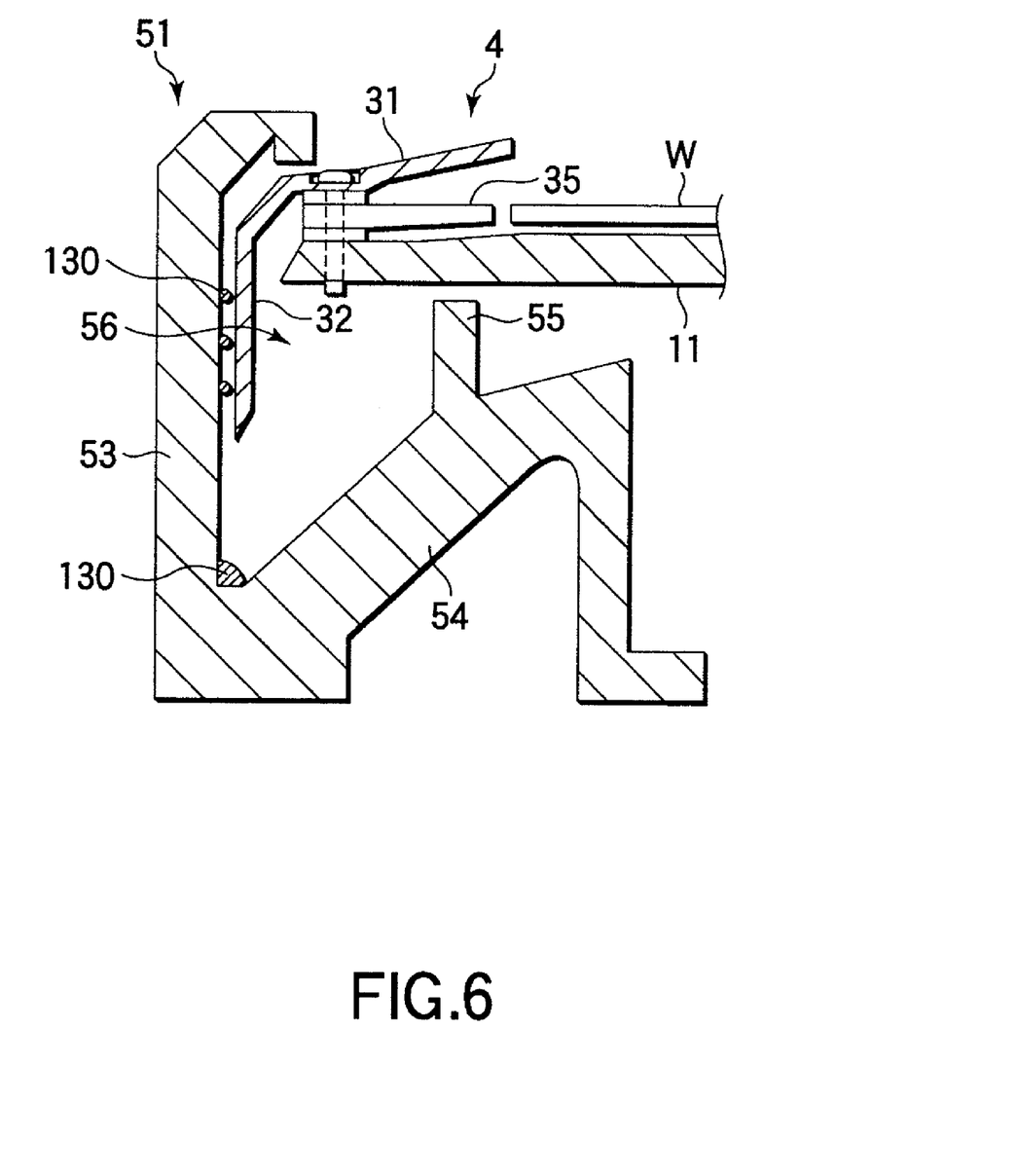
FIG. 6 is a sectional view showing a state of residual purified water in a drain cup after a rinsing process.

After the chemical liquid process and purified water rinsing process are performed, as described above, a subsequent chemical liquid process is performed by use of a different chemical liquid on the same wafer or by use of the same chemical liquid on a next wafer. In this respect, purified water used in the rinsing process cannot be completely removed, and so residual purified water 130 is present in the drain cup 51, as shown in FIG. 6, when the subsequent chemical liquid process is started.

Since the subsequent chemical liquid process is performed while the residual purified water 130 is present, the chemical liquid received by the drain cup 51 is mixed with residual purified water 130 and decreases its concentration. For this reason, the chemical liquid is first used to perform so called "co-cleaning" for washing away the residual purified water 130. Specifically, at first, the switching valve 111 is connected to the drain line 113 (i.e., the waste line 113 is enabled and the collection line 112 is disabled) to discard the chemical liquid received by the drain cup 51. Then, after the residual purified water is removed, the switching valve 111 is switched to the collection line 112 (i.e., the waste line 113 is disabled and the collection line 112 is enabled) to start collection of the chemical liquid.

Figure 7A:
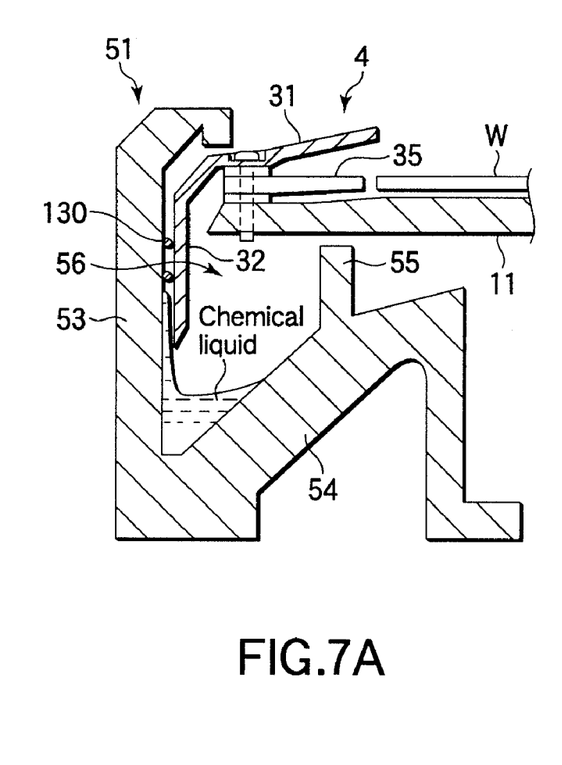
FIGS. 7A and 7B are sectional views schematically showing states of the drain cup during co-cleaning performed by use of a chemical liquid after a rinsing process, respectively when the wafer rotational speed is set to be lower than that of the rinsing process and when the wafer rotational speed is set to be equal to or higher than that of the rinsing process in accordance with this embodiment.

However, as described above, the rinsing process uses a relatively high rotational speed of 300 to 1,500 rpm, and so scattered purified water reaches an upper position inside the outer sidewall 53 of the drain cup 51. On the other hand, the chemical liquid process uses a lower rotational speed of 200 to 700 rpm, as compared to the rinsing process, and so the chemical liquid can hardly reach such an upper position inside the outer sidewall 53 of the drain cup 51, as shown in FIG. 7A. Accordingly, the co-cleaning time using the chemical liquid needs to be inevitably prolonged, and the amount of chemical liquid not collected but discarded is increased, thereby decreasing the collection rate of the chemical liquid.

Figure 7B:
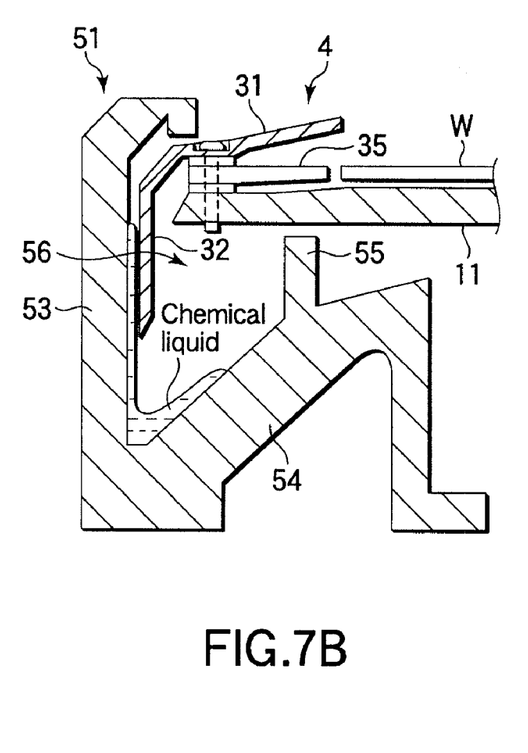

According to this embodiment made in light of this problem, when a chemical liquid process is performed after a rinsing process, a wafer W is first rotated by the rotary motor 3 at a rotational speed equal to or higher than that used in the rinsing process, while a chemical liquid is supplied onto the wafer W, to perform co-cleaning of the drain cup 51. Consequently, as shown in FIG. 7B, the chemical liquid swiftly reaches the position of the residual purified water 130 inside the drain cup and washes away the residual purified water 130 in a shorter time, so that the co-cleaning time using the chemical liquid is shortened.

Thereafter, the rotational speed of the wafer W is decreased to a value 200 to 700 rpm normally used for the chemical liquid process, and the switching valve 111 is switched to the collection line 112, to start collection of the chemical liquid, while continuing the chemical liquid process.

As described above, the co-cleaning is performed while the wafer is rotated at a rotational speed equal to or higher than that used in the rinsing process. Consequently, the co-cleaning time is shortened, and the amount of chemical liquid discarded is decreased, thereby improving the collection rate of the chemical liquid.

Next, an explanation will be given of another embodiment of the present invention.

Figure 8:
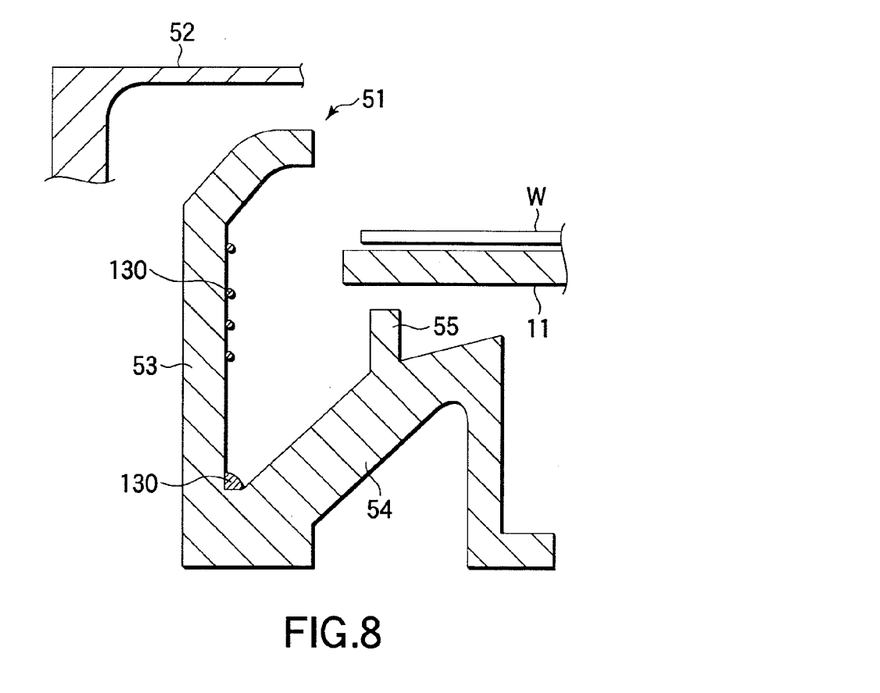
FIG. 8 is a sectional view showing a drain cup used in a substrate processing apparatus according to another embodiment of the present invention.

FIG. 8 is a sectional view showing a drain cup used in a substrate processing apparatus according to another embodiment of the present invention. In the former embodiment described above, the present invention is applied to an apparatus including the rotary cup 4. In this embodiment, the present invention is applied to an apparatus including no rotary cup.

The substrate processing apparatus according to this embodiment has basically the same structure as the substrate processing apparatus according to the former embodiment, except that it includes no rotary cup. Since the substrate processing apparatus includes no rotary cup, liquid scattered from the wafer W directly reaches the drain cup 51. In this apparatus, after a chemical liquid process and a rinsing process are sequentially performed, residual purified water 130 is present on the outer sidewall 53 of the drain cup 51, as shown in FIG. 8, as in the former embodiment.

Figure 9:
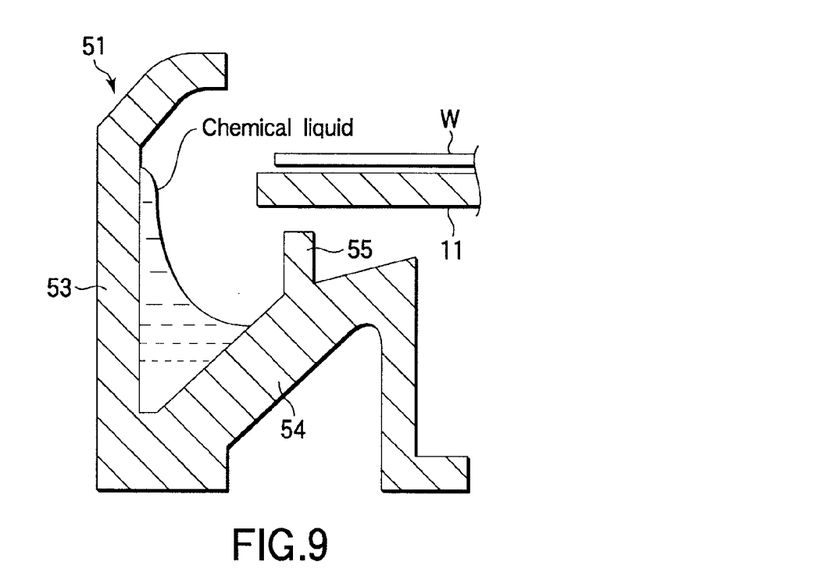
FIG. 9 is a sectional view showing a state of the drain cup shown in FIG. 8 when the wafer rotational speed is set thereafter to be equal to or higher than that of the rinsing process in accordance with an embodiment of the present invention.

Accordingly, even where no rotary cup is disposed as in this case, when a subsequent chemical liquid process is performed after the rinsing process, the wafer W is first rotated at a rotational speed equal to or higher than that used in the rinsing process. Consequently, the chemical liquid swiftly reaches the residual purified water 130 deposited at the uppermost position by the rinsing process, as shown in FIG. 9, so that the co-cleaning time using the chemical liquid is shortened.

In the former embodiment, the rotary cup 4 assists generation of a circular flow inside the drain cup 51 by its rotation and accelerates discharge of liquid from the drain cup 51. In this respect, since this embodiment includes no rotary cup that assists generation of a circular flow, the co-cleaning time entailing wastage of the chemical liquid becomes longer as compared to the former embodiment. In other words, although this embodiment can provide the effect of shortening the co-cleaning time by first rotating a wafer W at a rotational speed equal to or higher than that used in the rinsing process, the collection rate of the chemical liquid is lower, as compared to the former embodiment. This is so, because the former embodiment including a rotary cup provides not only the effect of shortening the co-cleaning time, but also the effect of accelerating discharge of the chemical liquid during the co-cleaning.

Figure 10:
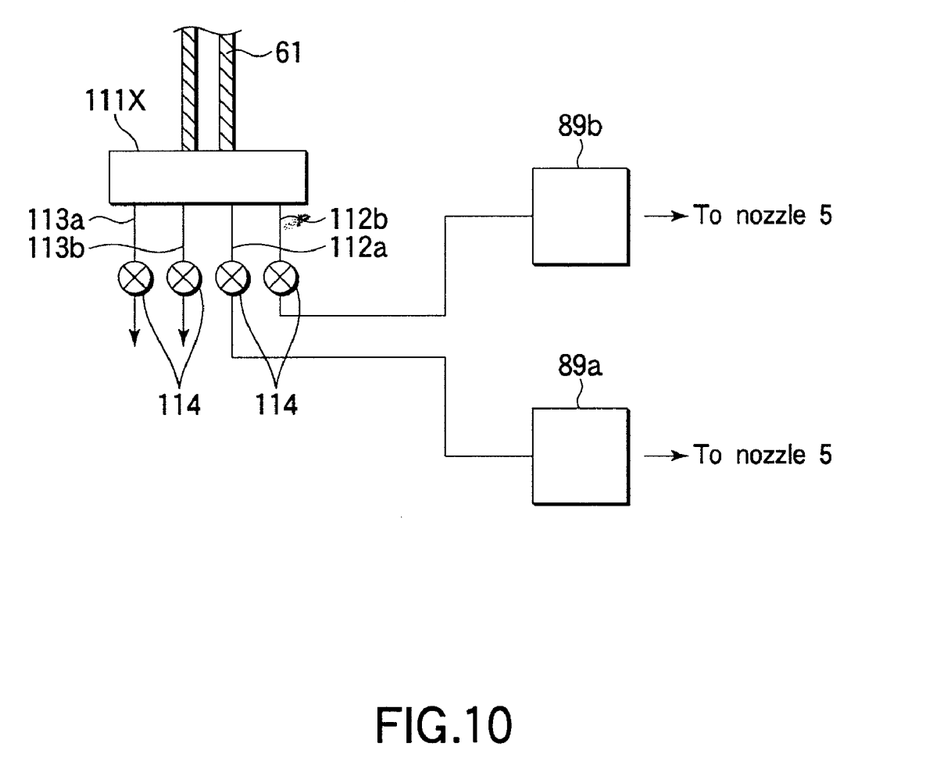
FIG. 10 is a view showing a liquid discharge system, along with a liquid supply system, used in a substrate processing apparatus (liquid processing apparatus) according to another embodiment of the present invention.

FIG. 10 is a view showing a liquid discharge system, along with a liquid supply system, used in a substrate processing apparatus (liquid processing apparatus) according to another embodiment of the present invention.

The liquid processing apparatus 100 of FIG. 1 is shown with only one chemical liquid system, for the sake of easy understanding. However, a liquid processing apparatus may be designed to sequentially perform cleaning processes using an alkaline chemical liquid and an acidic chemical liquid, respectively, on each wafer W. FIG. 10 shows a liquid discharge system used for such a liquid processing apparatus.

Specifically, the drain tube 61 is provided with a drain-switching member 111X, which is connected to an acid waste line 113a for discarding acidic drainage, an alkali waste line 113b for discarding alkaline drainage, an acid collection line 112a for collecting the acidic chemical liquid, and an alkali collection line 112b for collecting the alkaline chemical liquid. The acid collection line 112a and alkali collection line 112b are respectively connected to a tank 89a of an acidic chemical liquid (for example, dilute hydrofluoric acid (DHF)) and a tank 89b of an alkaline chemical liquid (for example, ammonia hydrogen peroxide solution (SC1)) disposed in a liquid supply system. The acid waste line 113a, alkali waste line 113b, acid collection line 112a, and alkali collection line 112b are respectively provided with valves 114.

With this arrangement, the process liquids are separately collected or discarded in accordance with the types thereof by sequentially performing process steps on each wafer W as described below. Consequently, even where a plurality of chemical liquids are used for each wafer W, it is possible to obtain the same effect as in the former embodiment. The following explanation excludes description concerning rotation of a substrate, because it is essentially the same as that used in the sequence described above with reference to FIGS. 5A to 7B. The order of cleaning using dilute hydrofluoric acid (DHF) and cleaning using ammonia hydrogen peroxide solution (SC1) may be reversed to that in the following explanation.

Specifically, when cleaning is performed by use of dilute hydrofluoric acid (DHF), the drain-switching member 111X is switched to the acid collection line 112a to collect drainage of the dilute hydrofluoric acid (DHF). When a rinsing process is performed after the cleaning using the dilute hydrofluoric acid (DHF), the drain-switching member 111X is switched to the acid waste line 113a to discard drainage of the dilute hydrofluoric acid (DHF) mixed with the rinsing liquid.

After this rinsing process, when cleaning is performed by use of ammonia hydrogen peroxide solution (SC1), the drain-switching member 111X is first switched to the alkali waste line 113b to discard drainage of the ammonia hydrogen peroxide solution (SC1) mixed with the rinsing liquid, during the co-cleaning process described above. Then, the drain-switching member 111X is switched to the alkali collection line 112b to collect drainage of the ammonia hydrogen peroxide solution (SC1). When a rinsing process is performed after the cleaning using ammonia hydrogen peroxide solution (SC1), the drain-switching member 111X is switched to the alkali waste line 113b to discard drainage of the ammonia hydrogen peroxide solution (SC1) mixed with the rinsing liquid.

The present invention is not limited to the embodiments described above and it may be modified in various manners. For example, the embodiments described above are exemplified by a cleaning processing apparatus for cleaning the front and back surfaces of a wafer. However, the present invention may be applied to a cleaning processing apparatus for cleaning only one of the front and back surfaces of a wafer. Further, in place of a cleaning process, the present invention may be applied to a liquid processing apparatus for performing another liquid process. In the embodiments described above, the target substrate is exemplified by a semiconductor wafer, but the present invention may be applied to another substrate, such as a substrate for flat panel display devices (FPD), a representative of which is a glass substrate for liquid crystal display devices (LCD).

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A substrate processing method for performing a substrate process by supplying a chemical liquid and a rinsing liquid onto a substrate held on a substrate holding member configured to rotate along with the substrate and surrounded by an annular drain cup that is configured to receive liquid scattered from a substrate being rotated and includes a portion forming an annular flow path through which the liquid thus received flows, the method comprising:

performing a rinsing process by supplying the rinsing liquid onto a substrate while rotating this substrate at a first rotational speed, while receiving the rinsing liquid scattered from this substrate by the drain cup; and then performing a chemical liquid process by supplying the chemical liquid onto a substrate while rotating this substrate, while receiving the chemical liquid scattered from this substrate by the drain cup, wherein the chemical liquid process comprises:

first performing an auxiliary process by supplying the chemical liquid onto the substrate while rotating the substrate at a second rotational speed not lower than the first rotational speed, thereby performing cleaning inside the drain cup by the chemical liquid, while discarding the chemical liquid received by the drain cup, such that said rotating the substrate at the second rotational speed causes a circular flow of the chemical liquid to be formed inside the annular flow path and to extend along an inner surface of the drain cup to a height not lower than residues of the rinsing liquid deposited during the rinsing process, thereby washing away the residues, and then performing a main process by supplying the chemical liquid onto the substrate while rotating the substrate at a third rotational speed for the chemical liquid process that is lower than the second rotational speed, while collecting for reuse the chemical liquid received by the drain cup.

2. The substrate processing method according to claim 1, wherein a rotary cup is disposed inside the drain cup to surround the substrate held on the substrate holding member and to rotate along with the substrate holding member and substrate, the rotary cup being configured to receive liquid thrown off from the substrate being rotated and to guide the liquid to the drain cup, and the method comprises assisting generation of the circular flow inside the annular flow path by rotation of the rotary cup inside the drain cup.

3. The substrate processing method according to claim 2, wherein the rotary cup is provided with a member connected thereto and inserted into the drain cup, so as to rotate along with the rotary cup to assist generation of the circular flow.

4. The substrate processing method according to claim 1, wherein the rinsing process is performed while rotating a first substrate at the first rotational speed and supplying the rinsing liquid onto the first substrate, the auxiliary process of the chemical liquid process is performed while rotating a target substrate, which is the first substrate or a new second substrate, at the second rotational speed and supplying the chemical liquid onto the target substrate while discarding liquid received by the drain cup, and the main process of the chemical liquid process is performed while rotating the target substrate at the third rotational speed and supplying the chemical liquid onto the target substrate, while collecting liquid received by the drain cup.

5. The substrate processing method according to claim 4, wherein the target substrate is the second substrate, and the method comprises, before the rinsing process, rotating the first substrate at the third rotational speed and supplying the chemical liquid onto the first substrate, thereby performing the chemical liquid process.

6. The substrate processing method according to claim 4, wherein the target substrate is the first substrate, and the method comprises, before the rinsing process, rotating the first substrate at a rotational speed lower than the first rotational speed and supplying a chemical liquid different from the chemical liquid onto the first substrate, thereby performing a different chemical liquid process.

7. The substrate processing method according to claim 1, wherein the method comprises performing the rinsing process, while discarding liquid received by the drain cup.

8. The substrate processing method according to claim 1, wherein said collecting for reuse the chemical liquid comprises sending the chemical liquid received by the drain cup into a collection line connecting the annular flow path to a chemical liquid tank that stores the chemical liquid.

9. The substrate processing method according to claim 1, wherein the annular flow path is connected to a waste line and a collection line through a common discharge tube, and the method comprises switching discard and collection of liquid received by the drain cup by switching connection of the common discharge tube between the waste line and the collection line.

10. A computer readable storage medium that stores a program for execution on a computer, wherein the program, when executed, causes the computer to control a substrate processing apparatus to conduct a substrate processing method for performing a substrate process by supplying a chemical liquid and a rinsing liquid onto a substrate held on a substrate holding member configured to rotate along with the substrate and surrounded by an annular drain cup that is configured to receive liquid scattered from a substrate being rotated and includes a portion forming an annular flow path through which the liquid thus received flows, the method comprising:

performing a rinsing process by supplying the rinsing liquid onto a substrate while rotating this substrate at a first rotational speed, while receiving the rinsing liquid scattered from this substrate by the drain cup; and then performing a chemical liquid process by supplying the chemical liquid onto a substrate while rotating this substrate, while receiving the chemical liquid scattered from this substrate by the drain cup, wherein the chemical liquid process comprises:

first performing an auxiliary process by supplying the chemical liquid onto the substrate while rotating the substrate at a second rotational speed not lower than the first rotational speed, thereby performing cleaning inside the drain cup by the chemical liquid, while discarding the chemical liquid received by the drain cup, such that said rotating the substrate at the second rotational speed causes a circular flow of the chemical liquid to be formed inside the annular flow path and to extend along an inner surface of the drain cup to a height not lower than residues of the rinsing liquid deposited during the rinsing process, thereby washing away the residues, and then performing a main process by supplying the chemical liquid onto the substrate while rotating the substrate at a third rotational speed for the chemical liquid process that is lower than the second rotational speed, while collecting for reuse the chemical liquid received by the drain cup.

* * * * *